United States Patent
Schepis et al.

(10) Patent No.: US 12,505,998 B2
(45) Date of Patent: Dec. 23, 2025

(54) METHOD FOR CHUCK COMPENSATION VIA WAFER SHAPE CONTROL

(71) Applicant: Tokyo Electron Limited, Tokyo (JP)

(72) Inventors: Anthony R. Schepis, Averill Park, NY (US); Daniel J. Fulford, Ballston Lake, NY (US); David C. Conklin, Saratoga Springs, NY (US); Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 602 days.

(21) Appl. No.: 17/967,257

(22) Filed: Oct. 17, 2022

(65) Prior Publication Data

US 2023/0326738 A1    Oct. 12, 2023

Related U.S. Application Data

(60) Provisional application No. 63/328,819, filed on Apr. 8, 2022.

(51) Int. Cl.
*H01L 21/02*    (2006.01)

(52) U.S. Cl.
CPC .. *H01L 21/02118* (2013.01); *H01L 21/02318* (2013.01)

(58) Field of Classification Search
CPC ............... H01L 21/02318; H01L 21/02118
See application file for complete search history.

(56) References Cited

U.S. PATENT DOCUMENTS

| | | | |
|---|---|---|---|
| 9,824,894 B2 | 11/2017 | Devilliers | |
| 9,842,879 B2 | 12/2017 | Matsugai | |
| 10,355,042 B2 | 7/2019 | Matsugai | |
| 10,763,431 B2 | 9/2020 | Ok et al. | |
| 10,854,667 B2 | 12/2020 | Matsugai | |
| 2006/0255819 A1* | 11/2006 | Koliopoulos | G01R 31/2831 324/756.07 |
| 2007/0103659 A1* | 5/2007 | Yoshitake | B82Y 40/00 355/53 |
| 2015/0294917 A1 | 10/2015 | Devilliers | |
| 2015/0380294 A1* | 12/2015 | Glasko | H01L 21/6838 279/3 |

(Continued)

FOREIGN PATENT DOCUMENTS

| | | | | |
|---|---|---|---|---|
| JP | 2002110516 A | * | 4/2002 | |
| KR | 20120112171 A | * | 10/2012 | ....... H01L 21/68707 |

(Continued)

OTHER PUBLICATIONS

International Search Report & Written Opinion issued Jun. 15, 2023 in PCT/US2023/013552, 8 pages.

*Primary Examiner* — Nathan H Empie
(74) *Attorney, Agent, or Firm* — Oblon, McClelland, Maier & Neustadt, L.L.P.

(57) ABSTRACT

Methods described herein address the chuck degradation challenge that can result in wafer distortion upon wafer coupling, leading to downstream fabrication issues. Techniques include actively monitoring wear of a chuck and counteracting chuck degradation by wafer shape manipulation to maintain an ideal working surface. Techniques include using chuck-based flatness metrology and/or modeling based on previous wafer level results and/or historical database of chuck wear information.

20 Claims, 4 Drawing Sheets

(56) References Cited

U.S. PATENT DOCUMENTS

| | | | |
|---|---|---|---|
| 2016/0163580 A1* | 6/2016 | Huang | H01L 21/68785 |
| | | | 29/559 |
| 2017/0117320 A1 | 4/2017 | Matsugai | |
| 2018/0204875 A1 | 7/2018 | Matsugai | |
| 2019/0355780 A1 | 11/2019 | Matsugai | |
| 2021/0183657 A1 | 6/2021 | Groechel et al. | |
| 2023/0038611 A1 | 2/2023 | Sircar et al. | |

FOREIGN PATENT DOCUMENTS

| | | | | |
|---|---|---|---|---|
| WO | WO-2008026739 A1 * | 3/2008 | | G03F 7/706837 |
| WO | WO 2021/154641 A1 | 8/2021 | | |

* cited by examiner ific examples of
METHOD FOR CHUCK COMPENSATION VIA WAFER SHAPE CONTROL

CROSS REFERENCE TO RELATED APPLICATIONS

This present disclosure claims the benefit of U.S. Provisional Application No. 63/328,819, filed on Apr. 8, 2022, which is incorporated herein by reference in its entirety.

FIELD OF THE INVENTION

The present disclosure relates to a method of semiconductor fabrication, and particularly to wafer overlay control.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, such as having less than 10 microns, or less than 1 micron, or less than 100 nanometers, of height deviation. Thus, a method for compensating for any chuck-based non-uniformities is desired.

SUMMARY

The present disclosure relates to a method of processing a substrate, including obtaining surface data of a surface of a chuck; generating a stress modification map based on the obtained surface data of the surface of the chuck; forming a first stress modification film on a first surface of a wafer; and modifying the first stress modification film based on the stress modification map, the modified first stress modification film modifying a shape of the wafer.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
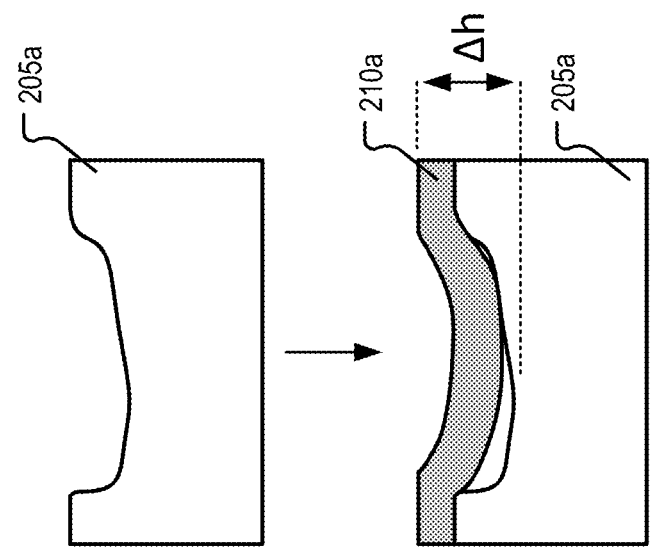
FIG. 1 is a cross-sectional diagram of a wafer interacting with a chuck, according to an embodiment of the present disclosure.
Figure 1:
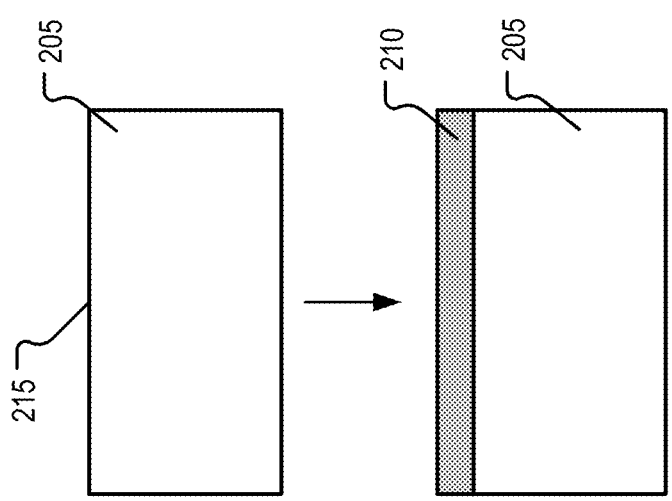

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

A typical semiconductor device (chip) is comprised of over 70 individual layers. Each level requires a pass through an imaging system to transfer the intended design pattern onto a working surface of the wafer through a lithographic process. The largest high volume manufacturing foundries start tens of millions of wafers through production lines every year. For example, a given foundry with a capacity of approximately 13 million wafers will require nearly a billion trips through lithography systems. To create semiconductor patterns, typically an optical lithography system is employed using deep ultraviolet (DUV) electromagnetic radiation to create high resolution relief image patterns in a photosensitive resist material. The resulting relief pattern can then be effectively employed as a template for selective deposition and etch processes (etch mask) in a layered fabrication scheme as specified for a given chip fabrication flow. The images realized in resist are projections of a master pattern on a photomask. The photomask is generally constructed of chromium and quartz which integrate to create opaque and transparent regions that control the propagation of source radiation at the mask interface. Such a pattern projection then defines a latent image as the light reaches/interacts with the resist material. The latent pattern is developed with one or more solvents, resulting in a relief pattern.

Modern projection lithography systems are extremely sensitive to height changes across the wafer surface. As such, the fidelity of the patterns across these 70+ layers is highly reliant on a stable operating surface. Any deviation in local height at the nanometer scale can induce shifts in critical dimension, line edge/width roughness, and general pattern integrity. Furthermore, these levels are integrated to form a working circuit and require accurate alignment to yield functioning chips. That is to say, a pattern on a layer 'n' may require alignment to a structure on a different layer 'x'. If the position of these features is not located where intended, electrical discontinuity can result in a non-yielding die. Thus, maintaining the integrity of the wafer grid is highly desired.

The placement, chucking, and removal of the wafers from the lithography tools can induce wear of the chuck over time given the quantity of wafers processed. Although catastrophic failure does not occur, the degradation has significant implications on device yield if left untreated. The degradation creates undue overhead for the process controller and cost for the foundry to take down the equipment to replace a chuck and/or re-qualify corresponding systems when the condition becomes unmanageable.

Described herein is a method and system to help mitigate the wafer degradation. Techniques include actively monitoring wear of a chuck and counteracting chuck degradation by wafer shape manipulation to maintain an ideal working surface. Techniques include using chuck-based flatness metrology and/or modeling based on previous wafer level results (CD, overlay, etc.) and/or historical database of chuck wear information. With chuck wear information collected, an optimal wafer shape can be calculated to optimize lithography imaging performance. A wafer shape can then be manipulated into the calculated, optimized shape via a stress control layer that can be selectively patterned and/or activated by heat and/or UV/IR exposure. Accordingly, techniques herein provide the ability to control wafer shape for optimized chucking to improve lithography performance and yield and decrease the frequency of planned maintenance related to chuck wear issues.

To this end, FIG. 1 is a cross-sectional diagram of a wafer 210 interacting with a chuck 205, according to an embodiment of the present disclosure. In an embodiment, as hundreds of thousands of the wafers 210 are cycled through lithography imaging equipment, a chuck surface 215 of the chuck 205 configured to receive the wafer 210 can deteriorate. FIG. 1 demonstrates such phenomena where the local difference in height shown in the cross section can impact the resolution of features being patterned. For example, on the left of FIG. 1, the chuck 205 shown includes a substantially planar chuck surface 215 and the wafer 210 coupled to the chuck surface 215 of the chuck 205 can remain substantially planar upon coupling (e.g., via vacuuming). For example, on the right of FIG. 1, a deteriorated chuck 205a can result from the aforementioned cycling of the many wafers 210 through the chuck 205. As shown, for example, the deterioration can result in a central portion of the chuck 205 being removed over time to yield the deteriorated chuck 205a. This can create a temporarily unstable working surface that distorts the wafer 210 grid under vacuum to yield a distorted wafer 210a. As shown, the distorted wafer 210a includes a bow along a central portion of the distorted wafer 210a.

Although not shown, for example, the deterioration can result in a peripheral portion of the chuck 205 being removed over time to yield the deteriorated chuck 205a. This can occur because, for example, the wafers 210 sliding across a track-based fabrication process can contact the periphery or edge of the chuck 205 as the wafers 210 are loaded onto the chuck 205. Furthermore, in order to compensate for this deterioration, some manufacturers of the chucks 205 can fabricate the brand new chucks 205 with a slight concave bow or raised peripheral lip instead of making the chuck surface 215 substantially planar in order to extend the lifespan of the chuck 205. In this scenario, a raised peripheral lip is formed when deterioration of the peripheral portion of the chuck 205 is expected. Conversely, a raised central portion (convex bow) can be formed in the brand new chucks 205 when deterioration of the central portion of the chuck 205 is expected. In both cases, the method described herein can analyze, detect, and compensate for the modified or non-planar chuck surface 215 of the brand new chuck 205 and the effect the non-planar chuck surface 215 of the brand new chuck 205 will have on the wafer 210.

Figure 2A:
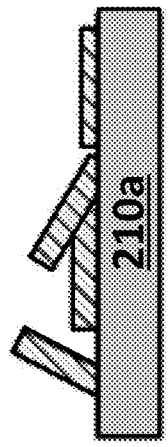
FIG. 2A is a cross-sectional substrate segment illustrating structures formed on the wafer and the distorted wafer, according to an embodiment of the present disclosure.
Figure 2A:
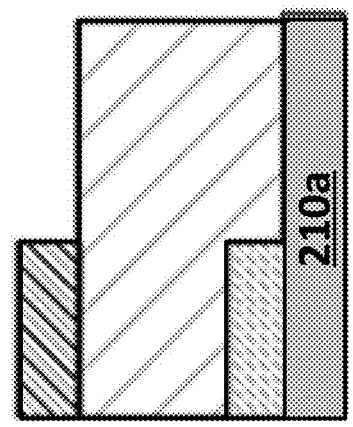

To this end, FIG. 2A is a cross-sectional substrate segment illustrating structures formed on the wafer 210 and the distorted wafer 210a, according to an embodiment of the present disclosure. In an embodiment, the defocus induced by the difference in height can lead to a change in pattern resist (the structures on the wafer 210 and the distorted wafer 210a) critical dimensions (CD) resulting in line collapse. On the left of FIG. 2A, the wafer 210, having no distortions while coupled to the planar chuck 205, yields no changes in the pattern resist CD and thus the pattern is eventually formed and developed without errors. Upon release from the chuck 205, any structures formed and developed on the wafer 210 are not affected because the substantially planar chuck 205 does not alter the shape of the wafer 210 while the wafer 210 is coupled to the chuck 205. On the right of FIG. 2A, the distorted wafer 210a, having been coupled to the deteriorated chuck 205a, is patterned while the surface of the distorted wafer 210a is distorted to the contour of the chuck surface 215 of the deteriorated chuck 205a and leads to the pattern having errors or collapsing upon release of the distorted wafer 210a from the deteriorated chuck 205a and eventual development. That is to say, the precursor to this failure (e.g., structure collapse shown) is deterioration of the latent image that occurs due to the height variation.

Figure 2B:
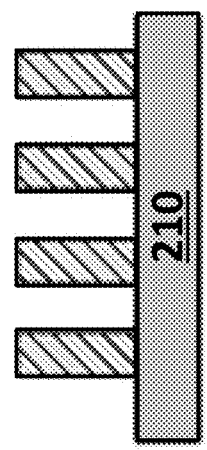
FIG. 2B is a cross-sectional substrate segment illustrating feature alignment to other layers, according to an embodiment of the present disclosure.
Figure 2B:
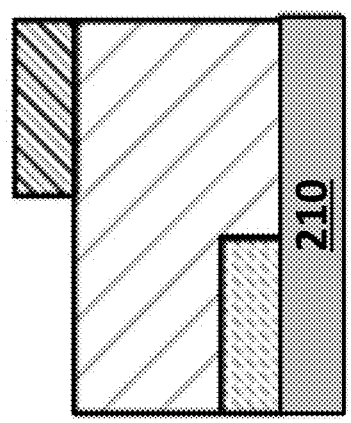

FIG. 2B is a cross-sectional substrate segment illustrating feature alignment to other layers, according to an embodiment of the present disclosure. In an embodiment, on the left of FIG. 2B, the resist is formed properly offset from the metal. On the right of FIG. 2B, the distorted wafer 210a includes an error in resist opening (upper feature/structure) to access the metal (lower feature/structure) through the dielectric (diagonal hatch lines). On the deteriorated chuck 205a, the resist covers access to the metal, which will result in an electrical open and potential device failure.

Described herein is a method to mitigate pattern and alignment degradation induced from chuck wear leading to wafer grid distortion. The method addresses this issue by proactively manipulating the shape of wafers to counteract the local chuck deformations. Based upon flatness metrology and/or modeling based on previous wafer level results (CD, overlay, etc.) and/or a historical database of chuck wear information, an optimized wafer shape can be calculated for the deteriorated chuck 205a.

Figure 3:
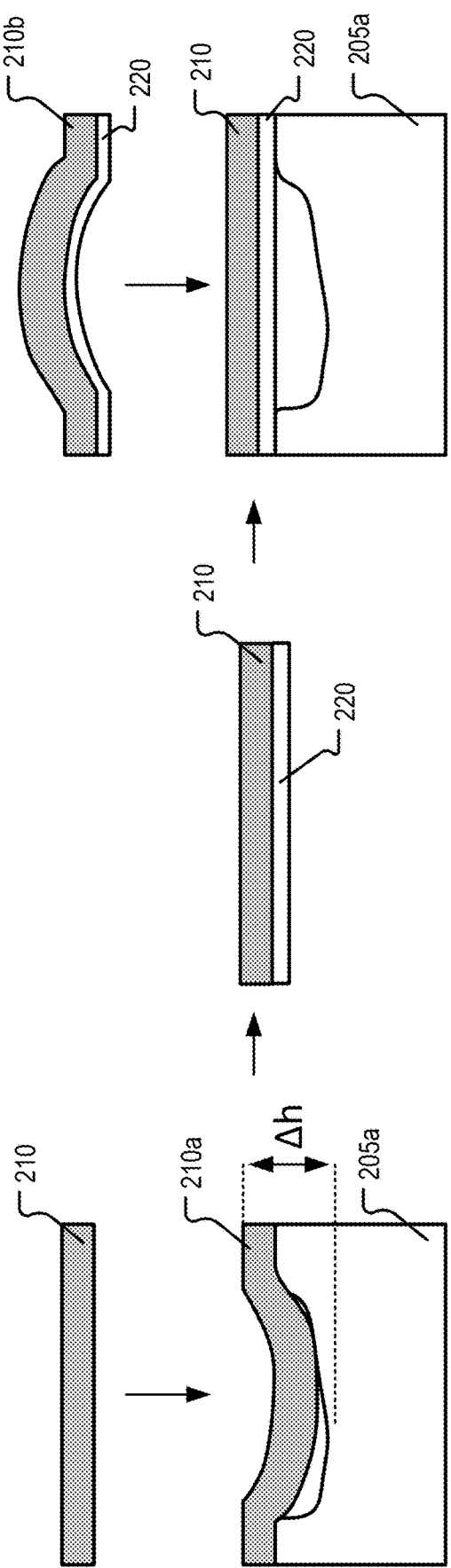
FIG. 3 is a cross-sectional schematic of wafer shape optimization based on chuck surface topology, according to an embodiment of the present disclosure.

To this end, FIG. 3 is a cross-sectional schematic of wafer shape optimization based on chuck surface 215 topology, according to an embodiment of the present disclosure. In an embodiment, the local height of the wafer 210 can be proactively modified with a stress modification film 220 such that the wafer 210 surface is level and can be created under vacuum, enabling processing and patterning of wafers as if the deteriorated chuck 205a were new. This physical manipulation can be co-optimized with the lithography system's compensation correction to afford even more degrees of freedom.

As shown, the wafer 210 coupled to the deteriorated chuck 205a can result in the formation of the distorted wafer 210a. Thus, the stress modification film 220 can be applied to the wafer 210 in order to adjust a shape of the wafer 210. The adjustment applied by the stress modification film 220 can be based on the chuck surface 215 of the deteriorated chuck 205a. For example, the adjustment applied by the stress modification film 220 can cause the wafer 210 to form an inverse shape relative to the chuck surface 215 of the deteriorated chuck 205a. As such, surface data of the chuck surface 215 for the deteriorated chuck 205a (or the chuck 205 even when new) can be obtained. The surface data of the chuck surface 215 can be obtained using myriad techniques, such as surface profilometry, atomic force microscopy, interferometry, scanning electron microscopy, and scanning tunneling microscopy, among others, or any combination thereof. Based on the surface data, a stress modification map can be generated. Additionally or alternatively, the stress modification map can be based on characteristics of the stress modification film 220 and a current stress state of the distorted wafer 210a. For example, the characteristics of the stress modification film can include, but are not limited to, uniformity relating to local variation in planarity and/or inherent variation in the stress profile of the stress modification film itself. For example, the current stress state of the distorted wafer 210a can be a first order bow, a second order bow (saddle bow) and/or any convolution of orders/shapes impacting the wafer globally/locally. For example, the stress modification map can describe a needed applied stress at locations along the wafer 210. For example, the stress modification map can indicate stress values to mitigate across coordinate locations along the surface of the wafer. The stress modification film 220 can then be formed on the wafer 210 and modified based on the stress modification map. In an embodiment, the wafer 210 can include a first surface and a second surface. For example, the first surface of the wafer 210 can be a working surface where the resist patterns and devices are to be formed and the second surface can be an opposite backside of the wafer 210.

In an embodiment, prior to forming the stress modification film 220, a protective film can be formed over the working surface of the distorted wafer 210a to protect any features or structures disposed thereon. The protective film can be removed after the stress modification film is modified.

In an embodiment, the backside of the wafer can have the stress modification film 220 formed thereon prior to coupling to the deteriorated chuck 205a. In an embodiment, the stress modification film 220 can be formed on the first surface of the wafer 210. The stress modification film 220 can be an organic or a polymer-based film. In any case, the stress modification film 220 can be modified or actuated to yield the modified wafer 210b. The stress-modification film 220 can crosslink upon exposure to light having a predetermined wavelength, or crosslink after light exposure followed by a bake or cure step. The light can be, for example, UV, visible, or IR. The chemistries included in the stress modification film 220 can include, but are not limited to, epoxy acrylates, epoxy novolaks, benzene cyclobutadiene (BCB) chemistry where Diels Alder reactions can induce crosslinking, and polyimides. Additionally or alternatively, the stress modification film 220 can be a film configured to release a stress-modification agent in response to actinic radiation. That is, the stress modification film 220 can include one or more photo acid generators, thermal acid generators, photo initiators, photo destructive bases, or the like. The stress modification film 220 can include various epoxy materials or resins or other organic materials that will result in stresses (tensile or compressive) within the stress modification film 220 from curing in the presence of acids, bases, or radicals.

Upon coupling to the deteriorated chuck 205a, the shape of the modified wafer 210b can be deformed by the coupling force. Now, with the pre-formed shape of the modified wafer 210b via the stress modification film 220, the shape of the modified wafer 210b when coupled to the deteriorated chuck 205a can be planar (i.e., flat like the wafer 210).

This same technology can also be used to improve new (non-worn) chuck performance by optimizing wafer shape that is influenced by process induced stressors existing on the wafer and/or other actors of the lithography system that could create a non-ideal condition for wafer exposure.

In an embodiment, the chuck surface 215 data can be obtained via internal and/or external metrology systems and/or process data (CD, overlay). That is, chuck surfaces 215 can be measured for flatness (spatial z-height map) and CD metrology data from processed wafers can be used to identify degradation. Additionally or alternatively, the chuck surface 215 data can be based on historical data tables and/or predictive wear from AI/machine learning. Using data from billions of the wafers 210 processed, such data can be analyzed by machine learning engines, neural networks, and AI engines to identify degradation patterns and progressions to generate the stress modification maps to adjust the shapes of the wafers 210. Training data for the neural network can include the chuck surface 215 data obtained via the previously described metrology techniques as compared to the predicted chuck surface 215 of the deteriorated chuck 205a based on the age of the deteriorated chuck 205a. Further, the chuck surface 215 can be measured at periodic timepoints or after a set number of wafers have been processed. A trend or predicted shape degradation can be determined and extrapolated for future wafers, and the shape of the future wafers can be adjusted based on the predicted shape degradation in order to remove the step of measuring the chuck surface that can be time-consuming.

In an embodiment, one or more layers of the stress modification film 220 can be formed on the wafer 210, with optional modification of such stress modification films 220 to modify or change a shape of the wafer 210. A single layer of the stress modification film 220 without modification can affect first-order shape correction. The described method can also induce second order and higher order corrections with stress modification film 220 modifications. For example, a given single layer of the stress modification film 220 or a stack of the stress modification film 220 can be applied that creates a compressive internal stress. Then, coordinate locations of the stress modification film 220 across the wafer 210 can be modified. Such modification can be from heat, actinic radiation, or etching to remove select portions of the stress modification film 220. As can be appreciated, by removing material or increasing/decreasing internal stress at point locations, the wafer 210 shape can be modified to yield the modified wafer 210b. In an embodiment, localized heating of the stress modification film 220 at the aforementioned coordinate locations can induce a change in the stress modification film 220 and form the desired wafer shape. By way of a non-limiting example, for areas of a chuck grid having erosion of material, a wafer 210 region that will be placed above a degraded region of the deteriorated chuck 205a can be sufficiently strengthened to resist bending at that location when being coupled to the deteriorated chuck 205a.

Methods herein can be co-optimized with lithography scanner compensations. Such processes can improve yield. Such processes can reduce down time and cost by limiting the frequency of planned maintenance for chuck swaps. This method can also be used to improve new (non-worn) chuck performance by optimizing wafer shape that has been deformed by process-induced stressors existing on the wafer and/or other actors of the lithography system that could create a non-ideal condition for wafer exposure.

Figure 4:
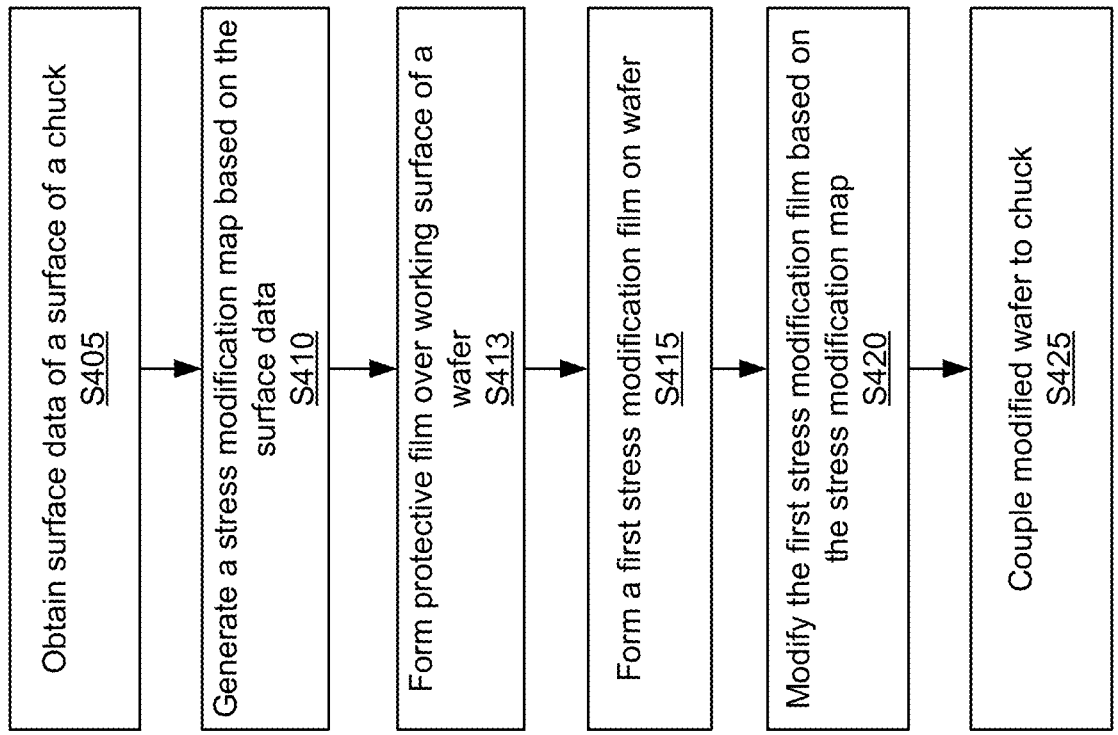
FIG. 4 is a flow chart for a method of processing a substrate, according to an embodiment of the present disclosure.

FIG. 4 is a flow chart for a method 400 of processing a substrate, according to an embodiment of the present disclosure.

In step S405, surface data of a surface of a chuck can be obtained.

In step S410, a stress modification map can be generated based on the surface data.

In step S413, a protective film can be formed over the working surface of a wafer.

In step S415, a first stress modification film can be formed on the wafer.

In step S420, the first stress modification film can be modified based on the stress modification map, thereby modifying a shape of the wafer that the first stress modification film is formed thereon.

In step S425, the modified wafer (and the first stress modification film) can be coupled to the chuck, such as the deteriorated chuck 205a. The modified wafer shape can mitigate any surface abnormalities or degradation of the deteriorated chuck 205a surface.

In an embodiment, the present disclosure relates to a method of processing a substrate, including obtaining surface data of a surface of a chuck; generating a stress modification map; forming a first stress modification film on a first surface of a wafer; and modifying the first stress modification film based on the stress modification map, the modified first stress modification film modifying a shape of the wafer, wherein the stress modification map is based on the obtained surface data of the surface of the chuck, characteristics of the first stress modification film, and a stress state of the wafer describing stresses acting on the wafer.

In an embodiment, the method further includes coupling the wafer and the modified first stress modification film to the chuck.

In an embodiment, the surface data maps relative z-height differences at coordinate locations of the surface of the chuck.

In an embodiment, the modifying the first stress modification film further comprises exposing the first stress modification film to a pattern of actinic radiation at a first predetermined wavelength, the first stress modification film configured to cause a stress change within the first stress modification film at locations along the first stress modification film exposed to the pattern of the actinic radiation.

In an embodiment, the stress change is a result of cross-linking within the first stress modification film based on the pattern of the actinic radiation.

In an embodiment, the modifying the first stress modification film further comprises exposing the first stress modification film to a pattern of heat above a predetermined temperature, the first stress modification film configured to cause a stress change within the first stress modification film at locations along the first stress modification film exposed to the pattern of the heat above the predetermined temperature.

In an embodiment, the surface data is obtained using at least one of surface profilometry, atomic force microscopy, interferometry, scanning electron microscopy, and scanning tunneling microscopy.

In an embodiment, the surface data is obtained from a database of historical chuck surface data.

In an embodiment, the surface data is obtained based on an output of a machine learning model, the output of the machine learning model being a predicted chuck surface topology as corresponding to an age of the chuck, the database of the historical chuck surface data, and obtained metrology data.

In an embodiment, the machine learning model includes a neural network trained on reference surface data of the chuck.

In an embodiment, the method further including forming a second stress modification film on the first stress modification film; and modifying the second stress modification film based on the stress modification map, the modified second stress modification film further modifying the shape of the wafer.

In an embodiment, the modifying the second stress modification film further comprises exposing the second stress modification film to a second pattern of actinic radiation at a second predetermined wavelength, the second stress modification film configured to cause a stress change within the second stress modification film at locations along the second stress modification film exposed to the second pattern of the actinic radiation.

In an embodiment, the first surface of the wafer is a backside of the wafer opposite a second surface of the wafer, the second surface of the wafer being a working surface.

In an embodiment, the second surface includes at least partially formed structures.

In an embodiment, the first surface of the wafer is a working surface of the wafer.

In an embodiment, the modifying the first stress modification film causes compressive stress in the first stress modification film.

In an embodiment, the modifying the first stress modification film causes tensile stress in the first stress modification film.

In an embodiment, the stress modification map indicates stress values to mitigate across coordinate locations along the first surface of the wafer.

In an embodiment, the modifying the first stress modification film further comprises executing a curing process.

In an embodiment, the chuck is included in a photolithography system and the modified wafer is processed using the photolithography system.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of processing a substrate, comprising:
obtaining surface data of a surface of a chuck;
generating a stress modification map;
forming a first stress modification film on a first surface of a wafer; and
modifying the first stress modification film based on the stress modification map, the modified first stress modification film modifying a shape of the wafer, wherein the stress modification map is based on the obtained surface data of the surface of the chuck, characteristics of the first stress modification film, and a stress state of the wafer describing stresses acting on the wafer.

2. The method of claim 1, further comprising coupling the wafer and the modified first stress modification film to the chuck.

3. The method of claim 1, wherein the surface data maps relative z-height differences at coordinate locations of the surface of the chuck.

4. The method of claim 1, wherein the modifying the first stress modification film further comprises exposing the first stress modification film to a pattern of actinic radiation at a first predetermined wavelength, the first stress modification film configured to cause a stress change within the first stress modification film at locations along the first stress modification film exposed to the pattern of the actinic radiation.

5. The method of claim 4, wherein the stress change is a result of crosslinking within the first stress modification film based on the pattern of the actinic radiation.

6. The method of claim 1, wherein the modifying the first stress modification film further comprises exposing the first stress modification film to a pattern of heat above a predetermined temperature, the first stress modification film configured to cause a stress change within the first stress modification film at locations along the first stress modification film exposed to the pattern of the heat above the predetermined temperature.

7. The method of claim 1, wherein the surface data is obtained using at least one of surface profilometry, atomic force microscopy, interferometry, scanning electron microscopy, and scanning tunneling microscopy.

8. The method of claim 1, wherein the surface data is obtained from a database of historical chuck surface data.

9. The method of claim 8, wherein the surface data is obtained based on an output of a machine learning model, the output of the machine learning model being a predicted chuck surface topology as corresponding to an age of the chuck, the database of the historical chuck surface data, and obtained metrology data.

10. The method of claim 9, wherein the machine learning model includes a neural network trained on reference surface data of the chuck.

11. The method of claim 1, further comprising
forming a second stress modification film on the first stress modification film; and
modifying the second stress modification film based on the stress modification map, the modified second stress modification film further modifying the shape of the wafer.

12. The method of claim 11, wherein the modifying the second stress modification film further comprises exposing the second stress modification film to a second pattern of actinic radiation at a second predetermined wavelength, the second stress modification film configured to cause a stress change within the second stress modification film at locations along the second stress modification film exposed to the second pattern of the actinic radiation.

13. The method of claim 1, wherein the first surface of the wafer is a backside of the wafer opposite a second surface of the wafer, the second surface of the wafer being a working surface.

14. The method of claim 13, wherein the second surface includes at least partially formed structures.

15. The method of claim 1, wherein the first surface of the wafer is a working surface of the wafer.

16. The method of claim 1, wherein the modifying the first stress modification film causes compressive stress in the first stress modification film.

17. The method of claim 1, wherein the modifying the first stress modification film causes tensile stress in the first stress modification film.

18. The method of claim 1, wherein the stress modification map indicates stress values to mitigate across coordinate locations along the first surface of the wafer.

19. The method of claim 1, wherein the modifying the first stress modification film further comprises executing a curing process.

20. The method of claim 1, wherein the chuck is included in a photolithography system and the modified wafer is processed using the photolithography system.

* * * * *